(12) United States Patent
Yeung et al.

(10) Patent No.: US 8,362,813 B2
(45) Date of Patent: Jan. 29, 2013

(54) RE-DRIVER WITH PRE-EMPHASIS INJECTED THROUGH A TRANSFORMER AND TUNED BY AN L-C TANK

(75) Inventors: Tony Yeung, Milpitas, CA (US);
Michael Y. Zhang, Palo Alto, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 120 days.

(21) Appl. No.: 13/071,448

(22) Filed: Mar. 24, 2011

(65) Prior Publication Data

US 2012/0242377 A1    Sep. 27, 2012

(51) Int. Cl.
*H03B 1/00* (2006.01)
(52) U.S. Cl. ........... 327/110; 327/108; 327/304; 326/88
(58) Field of Classification Search .................. 327/108, 327/110, 300, 304; 326/82, 88, 92
See application file for complete search history.

(56) References Cited

U.S. PATENT DOCUMENTS

| | | | |
|---|---|---|---|
| 4,542,440 A | 9/1985 | Chetty et al. | |
| 4,904,889 A * | 2/1990 | Chieli | 327/432 |
| 5,760,619 A * | 6/1998 | Yamaguchi | 327/110 |
| 6,429,632 B1 | 8/2002 | Forbes et al. | |
| 6,598,102 B1 | 7/2003 | Ninomiya et al. | |
| 6,785,151 B2 | 8/2004 | Ingman et al. | |
| 7,071,582 B2 | 7/2006 | Sae-Ueng et al. | |
| 2006/0214697 A1 | 9/2006 | Baude et al. | |
| 2006/0229046 A1 | 10/2006 | Bult et al. | |
| 2009/0108937 A1 | 4/2009 | Yamaguchi | |
| 2009/0195312 A1 | 8/2009 | Yamaguchi | |
| 2009/0231885 A1 | 9/2009 | Won et al. | |
| 2010/0052784 A1 | 3/2010 | Yamaguchi | |
| 2010/0052787 A1 | 3/2010 | Liu et al. | |

* cited by examiner

*Primary Examiner* — An Luu
(74) *Attorney, Agent, or Firm* — Stuart T. Auvinen (57) ABSTRACT

A re-driver circuit has pre-driver, intermediate, and output stages. Pre-emphasis on the output is generated by the intermediate stage and injected into an output stage. The intermediate stage is a frequency-tuned amplifier that has an inductive-capacitive L-C tank circuit that is tuned to a desired frequency of the output. The intermediate stage does not directly drive the output stage. Instead, an on-chip coupling transformer couples the L-C tank circuit to the output stage. The coupling transformer has a first inductor that is part of the L-C tank circuit in the intermediate stage, and a second inductor that is part of the output stage. Mutual inductance between the first inductor and the second inductor inductively couple a pre-emphasis voltage onto the output. The magnitude of the pre-emphasis can be changed by adjusting current in the intermediate stage.

21 Claims, 7 Drawing Sheets

RE-DRIVER WITH PRE-EMPHASIS INJECTED THROUGH A TRANSFORMER AND TUNED BY AN L-C TANK

FIELD OF THE INVENTION

This invention relates to re-driver integrated circuits (IC's), and more particularly to pre-emphasis injected through a transformer.

BACKGROUND OF THE INVENTION

Signal repeater and re-driver circuits are used in networking, communication, computer, and a variety of other systems. Upstream chips may have a limited drive capability, limiting the distance that signals may be safely driven. Standards such as Peripheral Components Interconnect Express (PCIE) and others may specify a limit to the length of a signal line.

A long-distance line may be divided into two or more segments, with a buffer, re-driver, or repeater between segments. A re-driver chip may be used to receive the signal from a first segment, regenerate the signal, and output the signal to the next segment. A wide variety of simple buffer chips are available. However, modern signals are often differential, small-voltage-swing signals. Buffers must not distort the signal's characteristics. Thus specialized differential re-drivers may be needed that are very sensitive to small-swing signals.

Communications sometimes occurs across longer lines known as transmission lines. When the speed or frequency of signaling increases, shorter line lengths act as transmission lines. Special layout and termination of transmission lines is often needed to minimize reflections and optimize performance.

The shape of the waveform being driven onto the transmission line as an input can be adjusted to improve performance. The initial portion of the waveform can be increased in amplitude relative to the rest of the waveform, which is known as pre-emphasis.

What is desired is a re-driver integrated circuit (IC) that is designed for repeating small-swing signals. A re-driver that compensates for transmission-line effects is desirable. A re-driver chip that boosts output signals using pre-emphasis is desirable. A re-driver chip that also shapes, amplifies, and equalizes signals to improve signal characteristics is also desirable.

DETAILED DESCRIPTION

The present invention relates to an improvement in re-drivers with pre-emphasis. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that pre-emphasis can be generated by an intermediate stage and injected into an output stage. An intermediate stage is a frequency-tuned amplifier that has an inductive-capacitive L-C tank circuit that is tuned to a desired frequency of the output. A transformer couples the amplifier and L-C tank circuit to the output stage. The transformer provides the inductance for the L-C tank circuit and also inductively couples the signal from the intermediate amplifier stage to the final output stage. The transformer can be integrated on-chip using existing IC processing technology.

Figure 1:
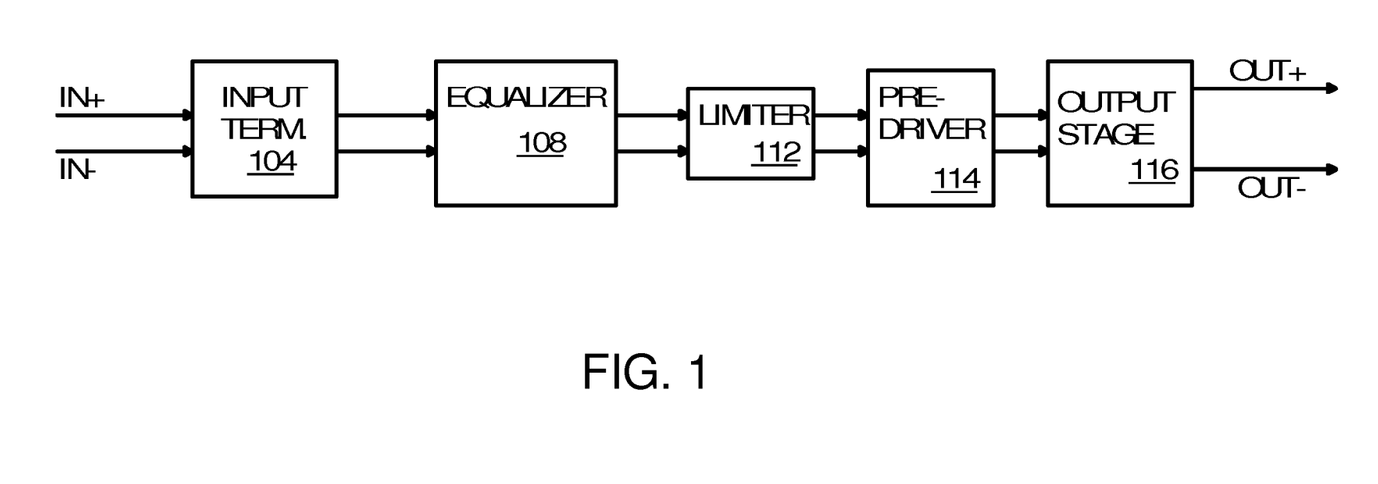
FIG. 1 is a block diagram of a re-driver chip with an L-C tank circuit that is coupled through a transformer to inject pre-emphasis.

FIG. 1 is a block diagram of a re-driver chip with an L-C tank circuit that is coupled through a transformer to inject pre-emphasis. Differential input IN+, IN− are differential small-swing signals that are sent by an upstream transmitter chip over a first segment of a transmission line. The upstream transmitter chip may be a Peripheral Components Interconnect Express (PCIE) transmitter, or may use another bus standard.

Differential output OUT+, OUT− has differential small-swing signals that are re-generated by the redriver chip and sent over a second segment of a transmission line to a receiver chip, such as a PCIE receiver. During signaling, OUT+, OUT− are generated from IN+, IN− with a small time delay. During signaling, the pair of lines in a differential signal swing in opposite directions, but when signaling is turned off, such as when a bus or a lane is powered down, the pair of signals may both be driven to a same voltage, such as the power-supply voltage VDD.

To protect the internal transistors from damage from small electrical shocks, such as during handling, Electro-Static-Discharge (ESD) protection circuit 104 is connected to inputs IN+, IN−. Another ESD protection circuit (not shown) could be connected to outputs OUT+, OUT−. ESD protection circuit 104 may contain a variety of structures designed to shunt current away from internal circuitry and to internal power and ground buses. For example, high-current reverse-biased diodes may be used.

Inputs IN+, IN− from ESD protection circuit 104 are applied to equalizer 108, which can be adjustable such as by programming parameters into programmable registers (not shown). Equalizer 108 can provide pre-emphasis or de-emphasis of signal pulses to alter the shape of pulses to remove pulse distortions that were caused by transmission over the first segment. Higher-frequency signal components may be attenuated or enhanced as necessary relative to lower-frequency signal components. Equalizer 108 is used to compensate the high frequency losses in the transmission line and can improve the opening in the eye diagram at the output. Equalizer 108 or ESD protection circuit 104 can adjust the input termination in response to a receiver detection circuit (not shown) so that the input impedance can better match the characteristics of the first segment of the transmission line connected to IN+, IN−.

After equalization, the signal from equalizer 108 is limited by limiter 112. Limiter 112 can clip signals that are over a limit voltage. Thus extreme voltage swings can be removed without distorting other parts of the signal.

Limiter 112 sends the clipped signal to pre-driver 114. Pre-driver 114 buffers the clipped signal and may perform a voltage shift or some amplification. Output stage 116 receives the signals from pre-driver 114 and provides large-current drive to outputs OUT+, OUT−.

Pre-driver 114 and output stage 116 repeat the input signal on IN+, IN− to OUT+, OUT−.

Figure 2:
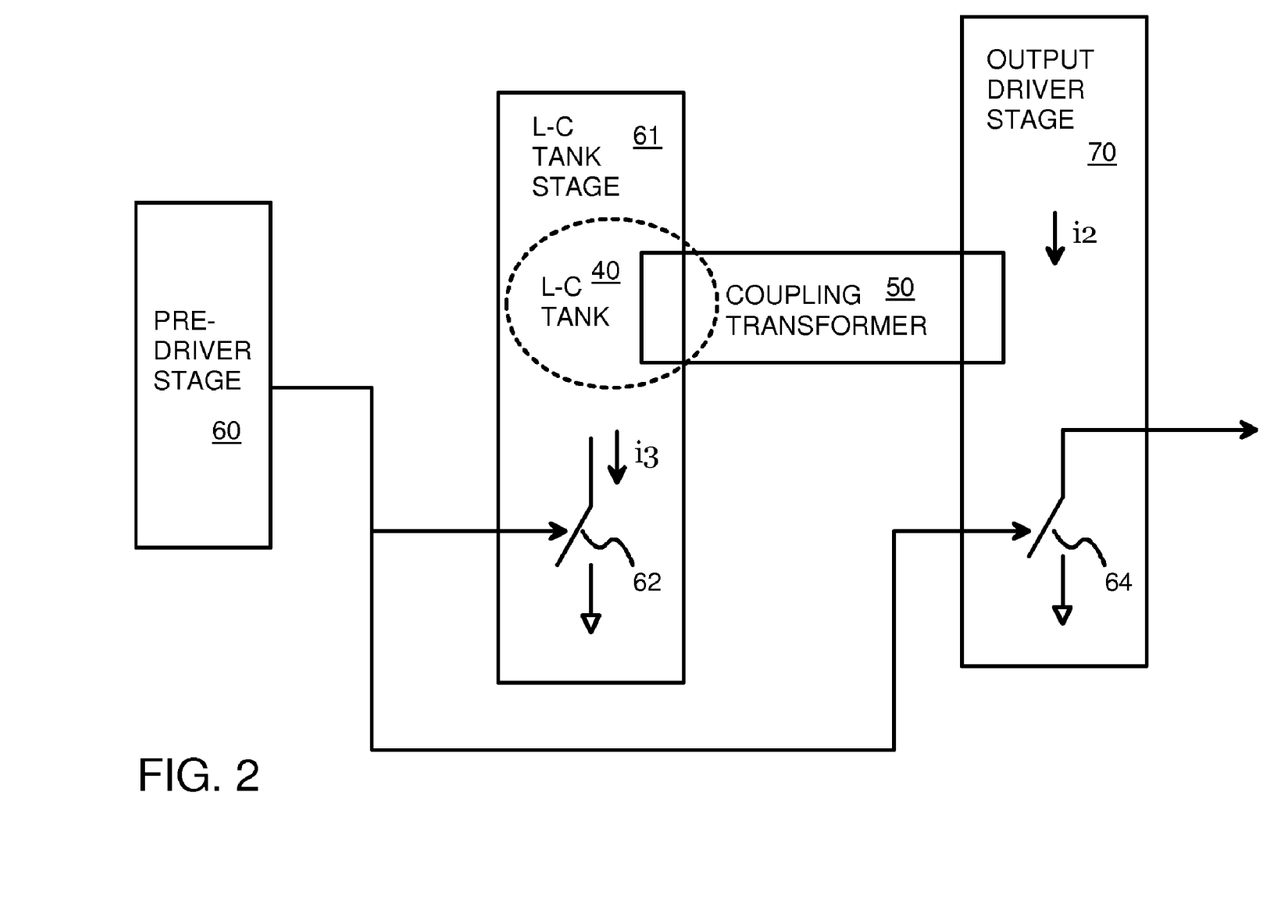
FIG. 2 is a conceptual block diagram of a tuned L-C tank circuit in an intermediate stage between the pre-driver and output stages using a transformer to couple a pre-emphasis signal to the output stage.

FIG. 2 is a conceptual block diagram of a tuned L-C tank circuit in an intermediate stage between the pre-driver and output stages using a transformer to couple a pre-emphasis signal to the output stage. Pre-driver stage 60 corresponds to pre-driver 114 of FIG. 1 and output driver stage 70 corresponds to output stage 116 of FIG. 1. However, a single-ended implementation rather than full differential is shown for simplicity.

To achieve high-frequency signal gain, pre-driver stage 60 drives both output driver stage 70 and intermediate stage 61. Pre-driver stage 60 drives the gate of intermediate-stage transistor 62, which sets the intermediate stage current i3. Pre-driver stage 60 also drives the gate of output-stage transistor 64.

L-C tank 40 in intermediate stage 61 has its resonate frequency tuned to transfer the maximum energy through coupling transformer 50. The inductance in coupling transformer 50 provides the inductor L for L-C tank 40, while the mutual inductance of coupling transformer 50 inductively couples a signal from intermediate stage 61 to output driver stage 70. The coupled portion of intermediate stage current i3 is constructively added to the output stage pull-up current i2. The additional coupled current from i3 provides pre-emphasis at high frequencies, boosting the output signal above VDD. At low frequency, the coupled current through coupling transformer 50 is zero or negligible.

The magnitude of the pre-emphasis can be varied by changing intermediate stage current i3, such as by increasing or decreasing the size or current drive of intermediate-stage transistor 62. The frequency component of the pre-emphasis is adjusted by adjusting the L and C values in L-C tank 40.

If L1 is the inductance value of coupling transformer 50 on the side of intermediate stage 61, and L2 is the inductance value of coupling transformer 50 on the side of output driver stage 70, the coupled voltage V1 on L2, which adds pre-emphasis in output driver stage 70, can be expressed as:

$$V1 = Vc2 + VL2$$

where Vc2 is the voltage from mutual coupling in coupling transformer 50, and VL2 is the voltage drop by self-inductance of the output side (L2).

$$V1 = Vc2 + VL2 = k*\text{Sqrt}(L1*L2)*d(i3)/dt + L2*d(i2)/dt$$

where d(i2)/dt is the time derivative of current i2, d(i3)/dt is the time derivative of current i3, and k is the coupling coefficient constant. These equations are a theoretical understanding of the inventors and are presented for explanatory purposes and are not meant to be limiting the invention.

The coupled voltage V1 through coupling transformer 50 creates the pre-emphasis in output driver stage 70. The coupled voltage, and thus the pre-emphasis produced, is a function of intermediate stage current i3, the inductance value of coupling transformer 50, and the rate of change of i2 and i3 (frequency of switching).

Figure 3:
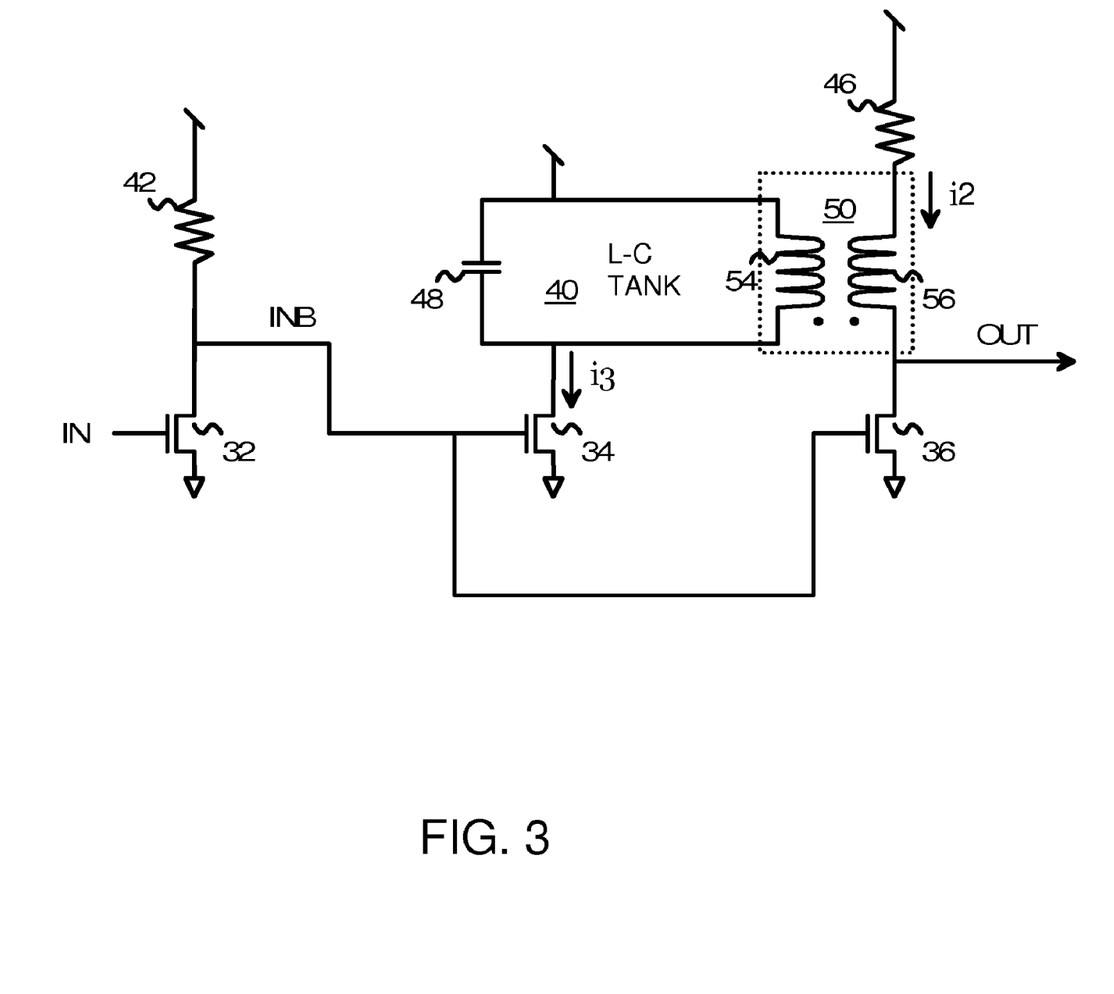
FIG. 3 is a schematic of a re-driver circuit with an intermediate L-C tank coupled to the output by a transformer.

FIG. 3 is a schematic of a re-driver circuit with an intermediate L-C tank coupled to the output by a transformer. A single-ended circuit is shown. An input signal IN is applied to the gate of n-channel pre-driver transistor 32, which has a drain driving buffered signal INB. Resistor 42 (or alternately a transistor pullup) is connected to buffered signal INB to drive it high when IN is low and n-channel pre-driver transistor 32 is off.

Buffered signal INB is applied to the gate of n-channel driver transistor 36, which drives output OUT low when IN is low. Buffered signal INB is also applied to the gate of n-channel intermediate transistor 34, which generates intermediate stage current i3 in the intermediate stage.

Intermediate stage current i3 is drawn through L-C tank 40, which includes tank capacitor 48 and first inductor 54 in parallel to the power supply VDD. First inductor 54 is the first set of windings in coupling transformer 50. The capacitive value C of tank capacitor 48 and the inductive value L1 of first inductor 54 are chosen during design to tune L-C tank 40 to a desired resonant frequency, such as near to the target switching frequency of IN and OUT. This tuning of the L-C resonant frequency can increase the energy transfer through coupling transformer 50 and the resulting pre-emphasis on OUT.

Output pull-up resistor 46 sources current from the power supply to output OUT through second inductor 56, which is the second set of windings in coupling transformer 50. The series connection of output pull-up resistor 46 and second inductor 56 between VDD and OUT provides output stage pull-up current i2 to OUT at low frequency, which second inductor 56 provides little or no resistance. Thus i2 is the static pull-up current. No pre-emphasis is provided at low frequencies.

At higher frequencies, second inductor 56 resists changes in current flow. The full static current i2 continues to flow to OUT when n-channel driver transistor 36 is suddenly turned off when INB goes low. The changes in current through second inductor 56 from i2 to 0 induces a voltage Vc2=L2*d(−i2)/dt due to self inductance.

When INB switches low, n-channel intermediate transistor 34 suddenly turns off, and the current through first inductor 54 turns off. The reduced current in first inductor 54 reduces the magnetic field, inducing a change in the current through second inductor 56. Initially, this current change in second inductor 56 is i3'. The reduced current in first inductor 56 from i3 to 0 induces a voltage VL2=k*sqrt(L1*L2)*d(−i3)/dt due to mutual coupling.

The current i3 flowing through first inductor 54 thus induces a similar current i3' to flow through second inductor 56. The direction of i3' in second inductor 56 is downward, since the coils are aligned. The layout of L1 and L2 is oriented such that the mutual coupling will increase the magnitude of pre-emphasis to each other as shown by the dots, causing i3' to be added to i2, increasing the current to OUT. The total current is i2+i3'.

When INB rapidly switches, intermediate stage is injecting a voltage of Vc2 due to mutual coupling plus a voltage of VL2 due to self-inductance to create an initial boost in the output voltage OUT=VDD−V1=VDD−Vc2−VL2=VDD+L2*d(i2)/dt+k*sqrt(L1*L2)*d(i3)/dt, or pre-emphasis=L2*d(i2)/dt+k*sqrt(L1*L2)*d(i3)/dt.

Before the falling edge arrives, i2 and i3 are zero. When INB changes state from low to high, then i2 and i3 conduct through 34 and 36. VL2=L2*d(i3)/dt and Vc2=k*sqrt(L1*L2)*d(i2)/dt. OUT=VDD−i2*rout−V1, so the output swings lower than VDD−i2*rout with pre-emphasis=L2*d(i2)/dt+k*sqrt(L1*L2)*d(i3)/dt.

Figure 4:
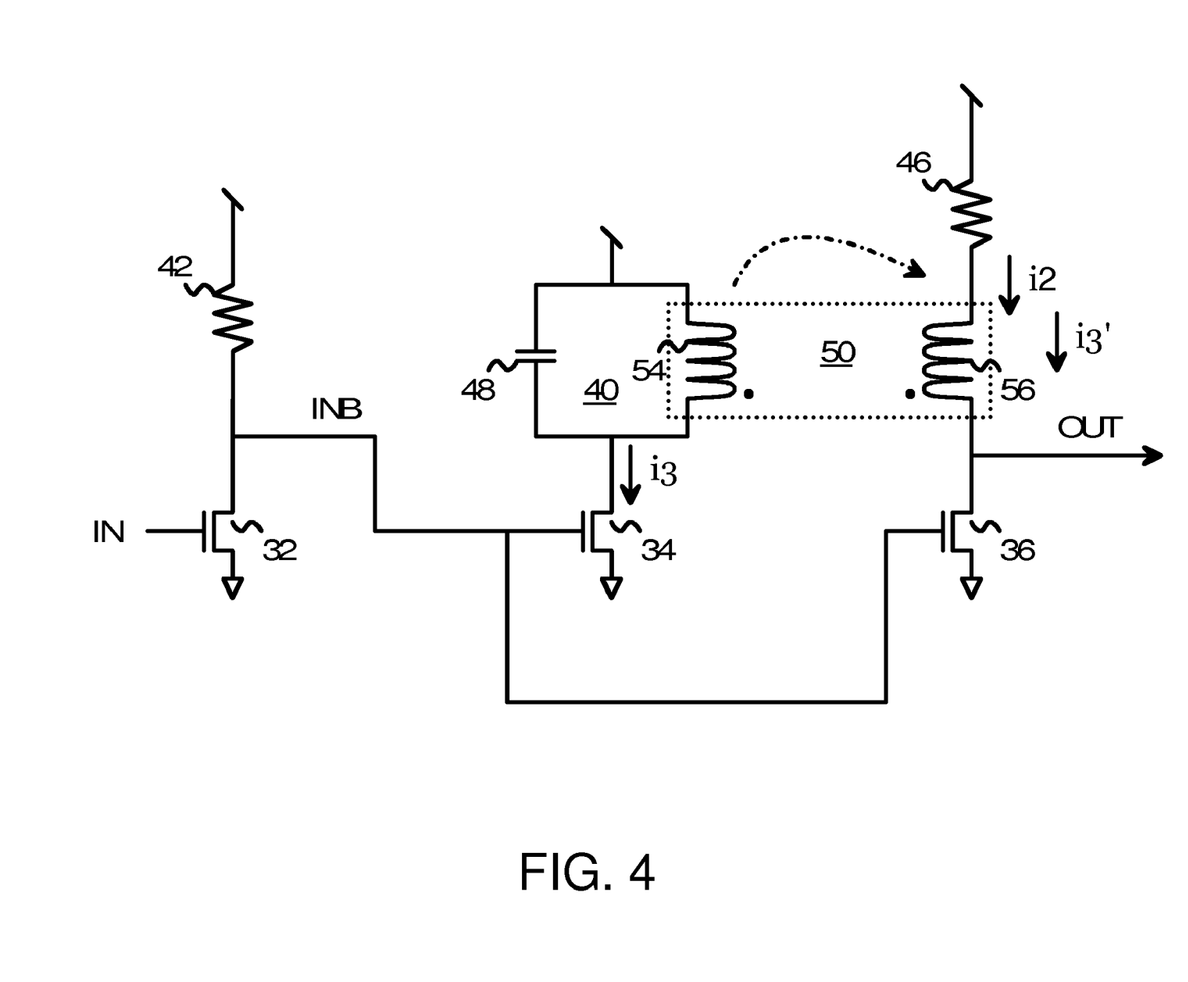
FIG. 4 highlights operation of the circuit of FIG. 3.

FIG. 4 shows operation of the circuit of FIG. 3. Current i3' is added to current i2 when INB falls and OUT rises at high frequency. Current i3' is inductively induced though coupling transformer 50.

Coupling transformer 50 could have a core of magnetic material to increase mutual inductance. Alternately, coupling transformer 50 could be a planar inductor, such as with metal layer 6 forming a spiral inductor (second inductor 56) and metal layer 5 forming the second output path, and metal layer 3 forming another spiral inductor (first inductor 54) and metal layer 2 forming the first output path. First inductor 54 and second inductor 56 are each metal spirals in separate layers that are stacked on top of one another to create the inductive coupling between them.

Figure 5A:
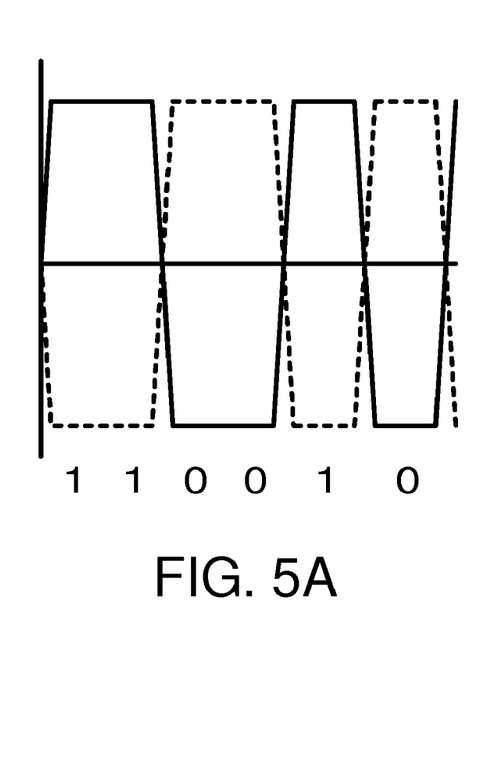
FIGS. 5A-B are waveforms highlighting pre-emphasis.
Figure 5B:
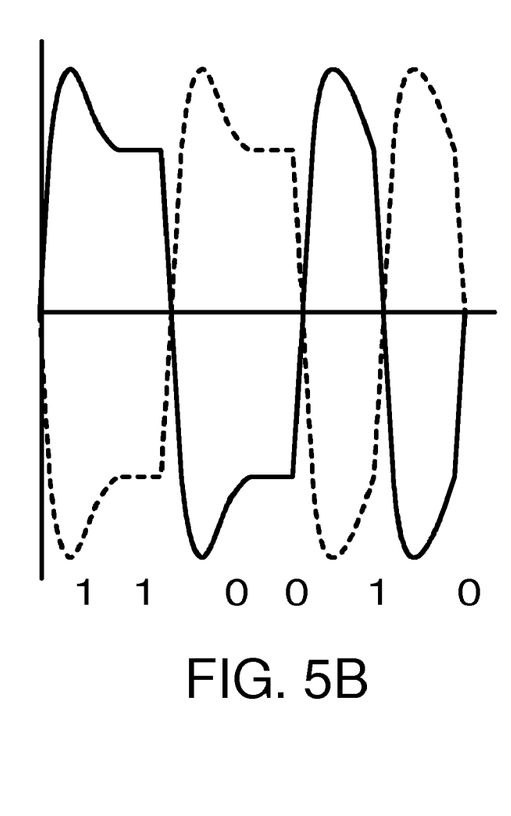

FIGS. 5A-B are waveforms highlighting pre-emphasis. In FIG. 5A, a coded signal encodes the bit sequence 110010. A differential pair of lines carries the signal, with the solid line in the graph showing the true differential line and the dashed line in the graph showing the complement differential line. The coding of the bit stream onto the differential lines may be a non-return-to-zero (NRZ) code that switches differential lines on bit transitions.

When the bit stream changes from a 1 to a 0, or from a zero to a 1, the true and complement differential lines are switched. When the bit stream does not change, the differential lines do not switch. The bit stream may itself have been pre-encoded such as using a run-length limited code to ensure that bits switch frequently enough so that a clock may be extracted.

Figure 7:
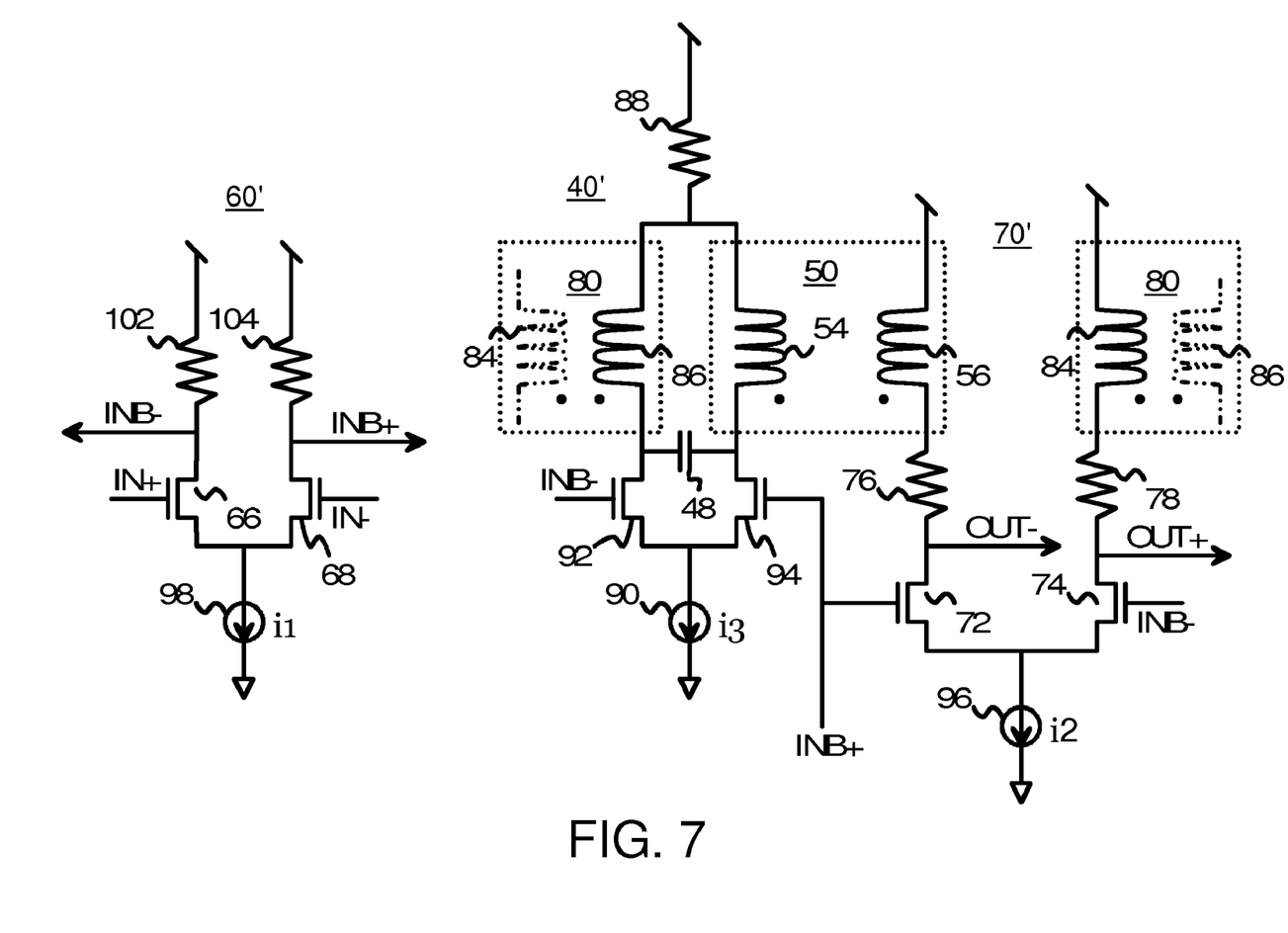
FIG. 7 is a schematic of a fully differential re-driver circuit with an intermediate L-C tank coupled to the output by transformers.

When the transformer-coupled L-C tank circuit such as shown in FIGS. 3, 4, 7 is applied to an input signal such as shown in FIG. 5A, the output waveform of FIG. 5B can be created. The output waveform of FIG. 5B contains pre-emphasis, since higher-amplitude spikes are added to each rising and falling edge of the waveform. These initial spikes may be 20 to 50% higher in amplitude than the flat portion of the waveform that follows each spike. These initial spikes can improve performance since a higher initial current occurs when first driving the transmission line during switching. Since the edge contains all the frequency components, and the following trace has a deterministic frequency response, pre-emphasis can be designed to cancel out the trace effect.

Figure 6:
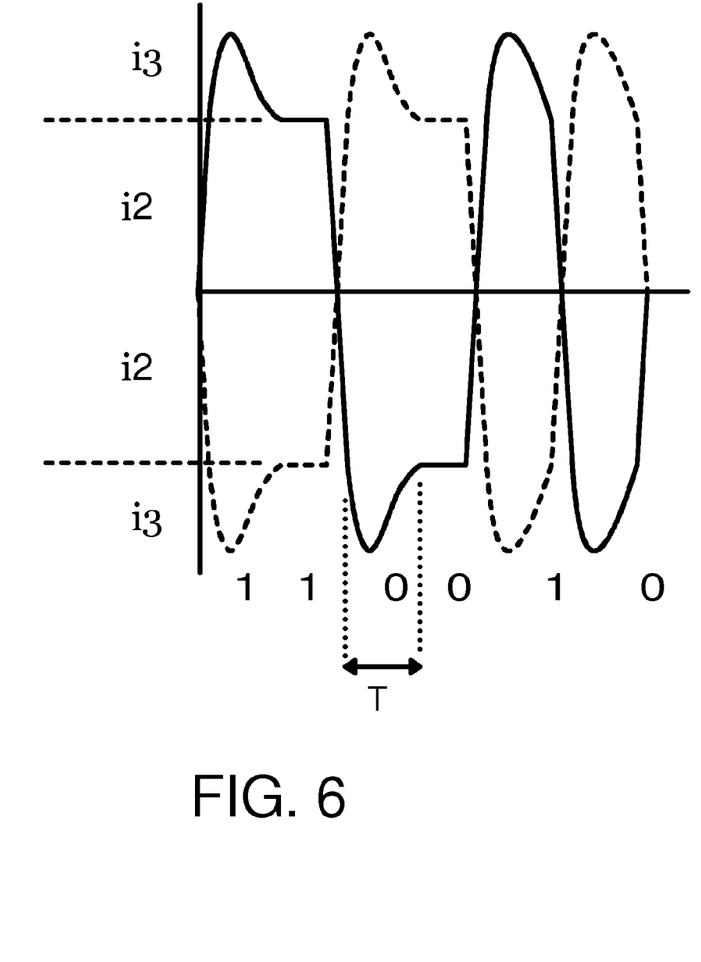
FIG. 6 is a waveform of showing how pre-emphasis relates to currents i2, i3 in FIGS. 3, 4, 7.

FIG. 6 is a waveform of showing how pre-emphasis relates to currents i2, i3 in FIGS. 3, 4, 7. Output stage pull-up current i2 is the bias current in n-channel driver transistor 36 that creates the bulk of the waveform of OUT. Intermediate stage current i3 is produced by L-C tank 40 and is the bias current in n-channel intermediate transistor 34, and is coupled through coupling transformer 50 to produce current i3' in output driver stage 70. Current i3' is added to current i2 in output driver stage 70 to boost the initial highs of the waveform of OUT on high-going pulses, and to enhance the lows of low-going pulses of OUT.

The time decay T of the pre-emphasis pulse is determined by the L-C time constant of L-C tank 40. The L-C time constant is L*C. 1/sqrt(L*C) is the resonant frequency and will affect the frequency of the peak gain in the intermediate stage which will eventually affect the rise and fall time during the transition region.

FIG. 7 is a schematic of a fully differential re-driver circuit with an intermediate L-C tank coupled to the output by transformers. Pre-driver stage 60' has n-channel differential transistors 66, 68 that receive a true and complement input IN+, IN−, on their respective gates, and generate INB−, INB+ on their respective drains. Pull-up resistors 102, 104 are also connected to INB−, INB+. Current i1 is steered by n-channel differential transistors 66, 68 from their sources, which receive current i1 from first current source 98.

The intermediate stage has current source 90, which generates intermediate stage current i3 and sinks i3 to ground. N-channel intermediate differential transistor 92 receives INB− on its gate, while n-channel intermediate differential transistor 94 receives INB+ on its gate. The sources of transistors 92, 94 are connected together and to current source 90, so that differential intermediate transistors 92, 94 steer current i3.

Tank capacitor 48 is connected between the drains of differential intermediate transistors 92, 94. First inductor 54 is part of coupling transformer 50 and connects to the drain of differential intermediate transistor 94, and to source resistor 88. Source resistor 88 is also connected to one terminal of complement first inductor 86, which is part of complement coupling transformer 80. Complement first inductor 86 connects between the drain of differential intermediate transistor 92 and source resistor 88. The other terminal of source resistor 88 is connected to power (VDD).

L-C tank 40' includes tank capacitor 48, coupled across the drains of differential intermediate transistors 92, 94, first inductor 54, and complement first inductor 86.

Output driver stage 70' has current source 96, which generates output stage current i2 and sinks i2 to ground. N-channel driver differential transistor 74 receives INB− on its gate, while n-channel driver differential transistor 72 receives INB+ on its gate. The sources of transistors 72, 74 are connected together and to current source 96, so that differential driver transistors 72, 74 steer current i2. Differential output OUT−, OUT+ is generated on the drains of differential driver transistors 72, 74, respectively.

Pull-up current to OUT− flows from the power supply, through second inductor 56 and output resistor 76 in series to OUT−. Pull-up current to OUT+ flows from the power supply, through complement second inductor 84 and output resistor 78 in series to OUT+.

First inductor 54 and second inductor 56 are part of coupling transformer 50. Inductive coupling through coupling transformer 50 provides an additional current i3' when OUT− is rising to create pre-emphasis on the OUT− waveform. Complement first inductor 86 and complement second inductor 84 are part of complement coupling transformer 80. Inductive coupling through complement coupling transformer 80 provides an additional current i3' when OUT+ is rising to create pre-emphasis on the OUT+ waveform.

Alternate Embodiments

Several other embodiments are contemplated by the inventors. For example cascading multi-stage pre-emphasis stages could be added to further boost the gain.

Output pull-up resistor 46 could be replaced with a p-channel transistor, or with another kind of transistor. An n-channel active inductor load could be used. Current sources can be implemented as n-channel transistors that receive a bias voltage on their gates. Some resistors could be replaced with transistors.

Pre-emphasis could be added only to high-going pulses, or only to low-going pulses, or to both high- and low-going pulses of output OUT. An additional L-C tank 40 and coupling transformer 50 could be added but in a reverse arrangement to provide pre-emphasis in the other (high-going output) direction.

Waveform shaping may also be used on the far end of the transmission line, at the receiver. De-emphasis is sometimes used to shape the signal received from a transmission line. Higher frequency components of waveforms tend to attenuate more than lower frequency components over a transmission line. This frequency-dependent attenuation causes portions of the waveform after transitions to have a lower amplitude than portions farther away from transition edges at the far end of the transmission line. The graph of the differential signals, or eye pattern, closes immediately after the switching transitions. Pre-emphasis and de-emphasis both attempt to increase amplitude after transitions to open up the eye pattern.

The current may be positive when the true differential line is high and the complement differential line is low. When the differential lines switch, the current changes direction. Then the current becomes "negative" when the true differential line is low and the complement differential line is high. Alternately, separate single-ended circuits such as shown in FIGS. 3-4 may be used, one for the true differential signal, and another for the complement differential signal.

Analog signals could be converted to or from digital signals at various locations, and could be further buffered, delayed, split, or combined. Even for an entirely analog circuit, the final output may feed into digital logic. While idealized input and output signals have been shown, actual signals may have noise, distortions, and other components. The idealized signals better show operation of the redriver. The real output of the redriver also could have various secondary components, yet still be useful.

Other components such as termination or series resistors, capacitors, buffers, etc. may be added. The transmission line may be a cable, or may be a backplane or wiring trace on a printed-circuit board (PCB) for high-speed signals. The transmission line could also be a twisted pair, telephone wires, or any media that carries electrical signals.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A method for re-driving with pre-emphasis an input signal comprising:
   receiving the input signal;
   using the input signal to switch an isolated current through a first inductor;
   using the input signal to switch an output;
   using mutual inductance to inductively couple changes in the isolated current flowing through the first inductor to generate a pre-emphasis current in a second inductor;
   adding a pre-emphasis voltage pulse to the output using the pre-emphasis current induced by mutual inductance in the second inductor,
   whereby pre-emphasis is added to the output using mutual inductance.

2. A re-driver with pre-emphasis comprising:
   a pre-driver stage for generating a buffered signal from a switching input that switches at a signal frequency;
   an intermediate stage, receiving the buffered signal, for switching an inductive current;
   an output stage, receiving the buffered signal on a gate of a driver transistor, the driver transistor driving an output low in response to the buffered signal;
   a pullup path in the output stage, the pullup path having a resistor and a second inductor in series between a power supply an the output;
   a tank circuit, in the intermediate stage, having a capacitor and a first inductor that have current switched by the buffered signal;
   a coupling transformer for inductively coupling the intermediate stage to the output stage, the coupling transformer having a first winding that comprises the first inductor in the intermediate stage, and a second winding that comprises the second inductor in the output stage;
   wherein switching of the inductive current in the intermediate stage is inductively coupled to the pullup path in the output stage by mutual inductance between the first inductor and the second inductor in the coupling transformer.

3. The re-driver with pre-emphasis of claim 2 wherein the intermediate stage comprises:
   an intermediate current source that is switched on and off by the buffered signal;
   wherein the capacitor and the first inductor are connected in parallel between the power supply and the intermediate current source;
   wherein the intermediate stage switches the tank circuit using the buffered signal.

4. The re-driver with pre-emphasis of claim 3 wherein the first inductor and the second inductor are aligned to each other to constructively couple a pre-emphasis voltage into the pullup path of the output stage when the inductive current is switched in the intermediate stage.

5. The re-driver with pre-emphasis of claim 4 wherein the pre-emphasis voltage initially increases a voltage of a high-going pulse of the output to a voltage above a static high voltage.

6. The re-driver with pre-emphasis of claim 5 wherein a duration of a pre-emphasis pulse of the output generated by the pre-emphasis voltage is a function of an inductance of the first inductor and a tank capacitance of the capacitor in the tank circuit,
   wherein duration of the pre-emphasis pulse is variable by varying the tank capacitance.

7. The re-driver with pre-emphasis of claim 6 wherein the intermediate stage is tunable to a resonate frequency that approximates the signal frequency by varying the tank capacitance relative to the inductance of the first inductor.

8. The re-driver with pre-emphasis of claim 3 wherein a magnitude of the pre-emphasis voltage is adjustable by adjusting a current of the intermediate current source.

9. The re-driver with pre-emphasis of claim 3 wherein the intermediate current source comprises a transistor that receives the buffered signal on a gate.

10. An inductively-coupled re-driver comprising:
a pre-driver that receives a switching input and generates a buffered signal;
an intermediate transistor that has a gate receiving the buffered signal, and a drain connected to a tank node, and a source connected to a ground;
a tank capacitor connected between the tank node and a power supply;
a first inductor connected between the tank node and the power supply;
an driver transistor that has a gate receiving the buffered signal, and a drain connected to an output node, and a source connected to the ground;
a pull-up connected between the power supply and the output node, the pull-up comprising a resistor and a second inductor in series;
wherein the first inductor and the second inductor together comprise a coupling transformer, wherein mutual inductance between the first inductor and the second inductor constructively add a pre-emphasis voltage to the output node when operating at high frequency, and do not add the pre-emphasis voltage to the output node when operating a low frequency, wherein low frequency is less than 1 kHz, and high frequency is at least 1 MHz;
whereby the pre-emphasis voltage is generated in the pull-up by mutual inductance from an intermediate stage.

11. The inductively-coupled re-driver of claim 10 wherein the coupling transformer is integrated onto a same silicon substrate as the driver transistor and the intermediate transistor and the tank capacitor,
whereby the coupling transformer is integrated onto a same chip.

12. The inductively-coupled re-driver of claim 11 wherein the first inductor is a first metal spiral pattern formed on a first metal layer;
wherein the second inductor is a second metal spiral pattern formed on a second metal layer;
wherein the first metal spiral pattern is stacked above or below the second metal spiral pattern to enable mutual inductance.

13. A differential redriver with inductively-injected pre-emphasis comprising:
a pre-driver stage, receiving a differential input, and generating a differential buffered signal comprising a true buffered signal and a complement buffered signal;
an intermediate current sink connected between an intermediate sink node and a ground;
a true differential intermediate transistor having a gate receiving the true buffered signal, a source connected to the intermediate sink node, and a drain connected to a true intermediate node;
a true first inductor connected between the true intermediate node and an intermediate source node;
a complement differential intermediate transistor having a gate receiving the complement buffered signal, a source connected to the intermediate sink node, and a drain connected to a complement intermediate node;
a complement first inductor connected between the complement intermediate node and the intermediate source node;
a tank capacitor connected between the true intermediate node and the complement intermediate node;
an output current sink connected between an output sink node and the ground;
a true differential output transistor having a gate receiving the true buffered signal, a source connected to the output sink node, and a drain connected to a complement output node;
a complement differential output transistor having a gate receiving the complement buffered signal, a source connected to the output sink node, and a drain connected to a true output node;
a true second inductor and a true pullup resistor connected together in series between the complement output node and a power supply; and
a complement second inductor and a complement pullup resistor connected together in series between the true output node and the power supply;
wherein the true first inductor and the true second inductor are mutually inductive and form a true coupling transformer;
wherein the complement first inductor and the complement second inductor are mutually inductive and form a complement coupling transformer.

14. The differential redriver with inductively-injected pre-emphasis of claim 13 wherein inductive coupling injects a pre-emphasis voltage onto the complement output through the true coupling transformer and onto the true output through the complement coupling transformer.

15. The differential redriver with inductively-injected pre-emphasis of claim 14 wherein a magnitude of the pre-emphasis voltage is adjustable by adjusting a current of the intermediate current sink.

16. The differential redriver with inductively-injected pre-emphasis of claim 13 further comprising:
an intermediate source resistor connected between the intermediate source node and a power supply.

17. The differential redriver with inductively-injected pre-emphasis of claim 13 wherein the true differential intermediate transistor, the complement differential intermediate transistor, the true differential output transistor, the complement differential output transistor each comprise an n-channel transistor.

18. The differential redriver with inductively-injected pre-emphasis of claim 17 wherein the true coupling transformer and the complement coupling transformer are integrated onto a same silicon substrate as the true differential intermediate transistor, the complement differential intermediate transistor, the true differential output transistor, the complement differential output transistor and the tank capacitor, whereby coupling transformers are integrated onto a same chip.

19. The differential redriver with inductively-injected pre-emphasis of claim 13 wherein the true first inductor is a first metal spiral pattern formed on a first metal layer;
wherein the true second inductor is a second metal spiral pattern formed on a second metal layer;
wherein the first metal spiral pattern is stacked above or below the second metal spiral pattern to enable mutual inductance.

20. The differential redriver with inductively-injected pre-emphasis of claim 13 further comprising:
an equalizer that shapes a waveform of data received over differential input to generate equalized data;

a limiter that clips voltages of the equalized data to generate the differential input to the pre-driver stage.

21. The differential redriver with inductively-injected pre-emphasis of claim 13 wherein the differential input operates at a target frequency;

wherein a capacitance value C of the tank capacitor and an inductive value L of the true first inductor and of the complement first inductor are selected so that L multiplied by C is within an order of magnitude of the target frequency, whereby the tank capacitor and inductors are tunable to the target frequency.

* * * * *